United States Patent
Hashimoto

[11] Patent Number: 6,128,067
[45] Date of Patent: *Oct. 3, 2000

[54] CORRECTING METHOD AND CORRECTING SYSTEM FOR MASK PATTERN

[75] Inventor: Koji Hashimoto, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/066,890

[22] Filed: Apr. 28, 1998

[51] Int. Cl.[7] .......................... G03B 27/68; G03B 27/42; G03B 27/32
[52] U.S. Cl. .................................. 355/52; 355/53; 355/77
[58] Field of Search .................................. 355/52, 53, 67, 355/77, 55; 430/5, 20, 22, 30, 311

[56] References Cited

U.S. PATENT DOCUMENTS

| | | | |
|---|---|---|---|
| 4,895,780 | 1/1990 | Nissan-Cohen et al. | 430/5 |
| 5,008,553 | 4/1991 | Abe | 250/492.2 |
| 5,182,718 | 1/1993 | Harafuji et al. | 364/490 |
| 5,208,124 | 5/1993 | Sporon-Fielder et al. | 430/5 |
| 5,393,988 | 2/1995 | Sakamoto | 250/492.22 |
| 5,422,491 | 6/1995 | Sakamoto | 250/492.22 |
| 5,424,173 | 6/1995 | Wakabayashi et al. | 430/296 |
| 5,451,480 | 9/1995 | Novembre | 430/30 |
| 5,498,887 | 3/1996 | Shiraki | 250/491.1 |
| 5,553,274 | 9/1996 | Liebmann | 395/500 |
| 5,879,844 | 3/1999 | Yamamoto | 430/30 |
| 5,906,903 | 5/1999 | Mimotogi | 430/30 |
| 5,969,801 | 10/1999 | Tsudaka | 355/55 |

Primary Examiner—Russell Adams
Assistant Examiner—Hung Henry Nguyen
Attorney, Agent, or Firm—Banner & Witcoff, Ltd.

[57] ABSTRACT

An optical-image simulation for a plurality of pattern data of a semiconductor integrated circuit is conducted based on different illuminating conditions, and a pattern bias in each of the illuminating conditions is calculated based on the result of the optical-image simulation. The plurality of pattern data of the semiconductor integrated circuit are CAD data corresponding to patterns of an actual circuit. Evaluation patterns which are produced while changing the illuminating conditions are electrically measured to obtain the pattern bias. A correction value of a mask pattern is obtained from the pattern bias which was obtained by a simulation under the same illuminating condition under which the pattern bias becomes zero. Therefore, it is possible to accurately interrelate the simulation result and an experimental data and thus, it is possible to obtain a correction value of an accurate mask pattern including a lithography margin.

26 Claims, 6 Drawing Sheets

(OFF-AXIS)

CORRECTING METHOD AND CORRECTING SYSTEM FOR MASK PATTERN

BACKGROUND OF THE INVENTION

The present invention relates to a correcting method and a correcting system for a mask pattern which is applicable for all of wafer processes such as lithography and etching.

Semiconductor integrated circuits have become smaller and smaller, and critical dimensions (CD) of a pattern is on the order of a submicron. When such a finely divided pattern is subjected to, e.g., a lithography process, it is difficult to obtain a desired pattern shape due to an influence of an approaching pattern (hereinafter called "optical proximity effect"). When a semiconductor integrated circuit including a memory, a logic circuit and the like is produced, if a lithography process is conducted while setting a light exposure condition in a region of the memory cell which is designed in the minimum size, a light exposure condition of a peripheral circuit is deviated from the optimum value due to the optical proximity effect. As a result, a width of the produced pattern unintentionally becomes wider or narrower than a designed value. Thereupon, those related to the present filed are more and more interested in a optical proximity correction (OPC) method for correcting a mask pattern in accordance with a pattern which is deviated from the designed value. However, a strict or perfect OPC method has not yet been established.

There is a method using a simulation as one example of conventional OPC methods. This simulation is a method for simulating an actual circuit using, as a parameter, data concerning the lithography. In the case of this method, because data of CAD (Computer Aided Design) can be used, there is a merit that a mask pattern can be corrected by a simple process. However, since only data concerning the lithography can be used in the method, it is difficult to make an accurate correction. This is because the wafer process includes not only aerial image elements but also other processes such as a developing of a resist pattern and an etching and thus, only data concerning lithography is insufficient.

There is an experimental method as another example of the conventional OPC method. In this method, a gate pattern of a transistor constituting a memory cell is produced on, e.g., a wafer as an evaluation pattern, and the evaluation pattern is measured by, e.g., a scanning electron microscope, thereby correcting the pattern on the mask in accordance with data of the measurement. In this method, because a final size of the evaluation pattern which is actually produced is measured, it is possible to take into account elements concerning the proximity effect such as a mask, a lithography and an etching. However, such an evaluation pattern is only a portion of an actual semiconductor integrated circuit, and does not represent all of the patterns. Therefore, it is not easy to accurately correct, at high speed, a pattern of an actual semiconductor integrated circuit. As described above, it is difficult to accurately conduct the OPC at high speed in the conventional arts.

BRIEF SUMMARY OF THE INVENTION

It is an object of the present invention to provide a correcting method of a mask pattern which is capable of accurately correcting the mask pattern at high speed by using data obtained by an optical simulation and data obtained by conducting experiments, and to provide a correcting system thereof.

The above object can be achieved by the following system. A correcting system for a mask pattern comprising: a simulator for conducting an optical-image simulation for a plurality of pattern data of a semiconductor integrated circuit based on different illuminating conditions, the simulator calculating a pattern bias in each of the illuminating conditions based on the result of the optical-image simulation; a producing device for producing an evaluation pattern for evaluating a characteristic of the semiconductor integrated circuit based on the different illuminating conditions; a measuring device for measuring a final size of the evaluation pattern produced by the producing device; a first calculating section for obtaining an illuminating condition in which zero bias is obtained from final size measured by the measuring device; and a second calculating section for calculating a correction value of the mask pattern based on a pattern bias calculated by the simulator under the same illuminating condition that was obtained by the first calculating section as having zero bias.

The above object can be achieved by the following system. A correcting system for a mask pattern comprising: a simulator for conducting an optical-image simulation for a plurality of pattern data of a semiconductor integrated circuit based on different illuminating conditions, the simulator calculating a pattern bias in each of the illuminating conditions based on the result of the optical-image simulation; a producing device for producing an evaluation pattern for evaluating a characteristic of the semiconductor integrated circuit based on the different illuminating conditions; a measuring device for measuring a final size of the evaluation pattern produced by the producing device; a first calculating section for obtaining an illuminating condition in which a common process window of each of the evaluation patterns becomes maximum from the final size measured by the measuring device; and a second calculating section for calculating a correction value of the mask pattern based on a pattern bias calculated by the simulator under the same illuminating condition that was obtained by the first calculating section as having the maximum common process window.

The above object can be achieved by the following method. A correcting method for a mask pattern comprising the steps of: conducting an optical-image simulation for a plurality of pattern data of a semiconductor integrated circuit based on different illuminating conditions, so as to calculate a pattern bias in each of the illuminating conditions based on the result of the optical-image simulation; producing an evaluation pattern for evaluating a characteristic of the semiconductor integrated circuit based on the different illuminating conditions; measuring a final size of the produced evaluation pattern; and the method further comprising: a first calculating step to obtain an illuminating condition in which zero bias is obtained from the measured final size; and a second calculating step for calculating a correction value of the mask pattern based on a pattern bias calculated by the simulation under the same illuminating condition that was first calculated as having zero bias.

The above object can be achieved by the following method. A correcting method for a mask pattern comprising the steps of: conducting an optical-image simulation for a plurality of pattern data of a semiconductor integrated circuit based on different illuminating conditions, so as to calculate a pattern bias in each of the illuminating conditions based on the result of the optical-image simulation; producing an evaluation pattern for evaluating a characteristic of the semiconductor integrated circuit based on the different illuminating conditions; measuring a finishing size of the produced evaluation pattern; and the method further comprising: a first calculating step to obtain an illuminating condition in which a common process window of each of the evaluation patterns becomes maximum from the measured finishing size; and a second calculating step for calculating a correction value of the mask pattern based on a pattern bias calculated by the simulation under the same illuminating condition that was obtained by the first calculating step as having the maximum common process window.

According to the present invention, a correction value for the mask pattern is calculated by: 1) data obtained by aerial-image simulating a plurality of pattern data of a semiconductor integrated circuit while changing the illuminating conditions; and 2) data experimentally obtained from the evaluation pattern which is produced while changing the illuminating conditions. Therefore, it is possible to accurately characterize the data obtained by simulation and the data obtained experimentally and thus, it is possible to obtain, at high speed, an accurate correction value of the mask pattern including a margin of the lithography.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

With reference to the accompanying drawings, embodiments of the present invention will be described below.

Although the present invention will be described based on a case where a mask pattern of DRAM is corrected as an example, this invention is not limited to the DRAM, and is also applicable to an SRAM (Static RAM), a nonvolatile memory, a logic integrated circuit, and the like. The present invention makes it possible to accurately correct a mask pattern at high speed by an optical-image simulation and an experimental data.

First, a principle of this invention will be described.

A total pattern bias ($\delta$ total) which indicates a CD (critical dimension) difference from a memory cell region including all the wafer processes is represented by the following equation (1):

$$\delta \text{ total} = \delta \text{ aerial} + \delta \text{ development} + \delta \text{ etching} + \delta \text{ other} \quad (1)$$

wherein, $\delta$ aerial is a CD difference due to an optical image, $\delta$ development is a CD difference due to a development, $\delta$ etching is a CD difference due to an etching, and $\delta$ other is a CD difference due to other processes such as a masking.

Among the above-described elements, $\delta$ aerial largely depends on the illuminating conditions of the exposing system. The other three elements hardly depend on the illuminating conditions, but depend on, e.g. a pattern arrangement and a pattern density. The following other total pattern biases based on some illuminating conditions can be obtained using the equation (1):

Illumination (I)

$$\delta \text{ total,(I)} = \delta \text{ aerial,(I)} + \delta \text{ development,(I)} + \delta \text{ etching,(I)} + \delta \text{ other,(I)} \quad (2)$$

Illumination (II):

$$\delta \text{ total,(II)} = \delta \text{ aerial,(II)} + \delta \text{ development,(II)} + \delta \text{ etching,(II)} + \delta \text{ other,(II)} \quad (3)$$

In the above equations (2) and (3), $\delta$ total,(I) and $\delta$ total,(II) are total pattern biases (CD difference) in the illuminating conditions (I) and (II), respectively. $\delta$ aerial,(I) and $\delta$ aerial,(II) are CD differences due to aerial images in the illuminating conditions (I) and (II), respectively.

In the equations (2) and (3), $\delta$ development,(I); $\delta$ development,(II); $\delta$ etching,(I); $\delta$ etching,(II); $\delta$ other,(I); and $\delta$ other,(II) hardly depend on the illuminating conditions of the exposing system. Therefore, if $\delta$ development,(I) is equal to $\delta$ development,(II); $\delta$ etching,(I) is equal to $\delta$ etching,(II); and $\delta$ other,(I) is equal to $\delta$ other,(II), the following equation (4) can be obtained:

$$\delta \text{ total,(I)} = \delta \text{ total,(II)} + (\delta \text{ aerial,(I)} - \delta \text{ aerial,(II)}) \quad (4)$$

The above equation (4) shows that a total process bias $\delta$ total,(I) based on an illuminating condition (I) can be indicated only by an optical image, if only the total process bias $\delta$ total,(II) based on another illuminating condition (II) is known. A strict value for the element ($\delta$ aerial,(I)–$\delta$ aerial,(II)) can be obtained using a simulator such as a known solid-c (sigma-c corp.) or FAIM (VECTOR TECHNOLOGIES, INC.(VT1)). A value for each of $\delta$ aerial,(I) and $\delta$ aerial,(II) can experimentally be obtained as a strict numerical value using a measuring device such as a scanning electron microscope or an electric characteristic evaluation system.

First Embodiment

Figure 2:
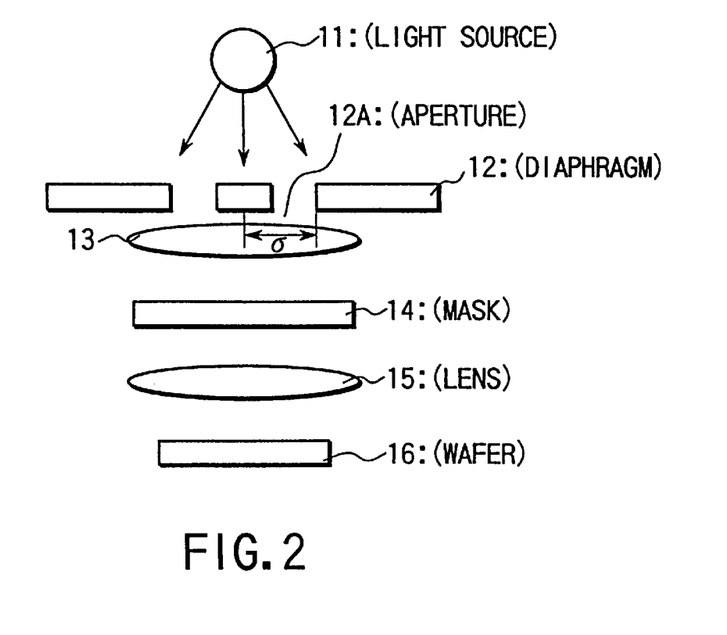
FIG. 2 is a diagram for showing a structure of one example of a light-exposure device.
Figure 3A:
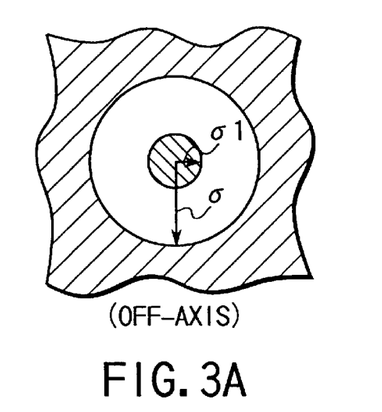
FIGS. 3A, 3B and 3C are views for explaining various illuminating conditions.
Figure 3B:
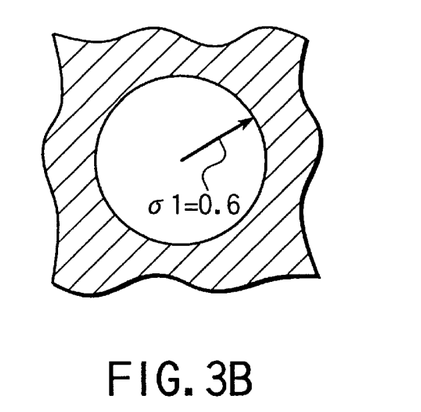
Figure 3C:
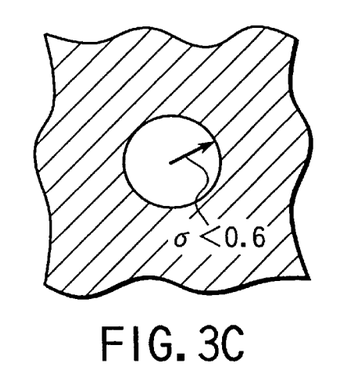

First, results of the aerial-image simulation with respect to pattern biases of a DRAM cell region and a peripheral circuit under several illuminating conditions. FIG. 2 shows one example of a light-exposing device. A diaphragm 12 having an aperture 12A is disposed between a light source 11 and a lens 13. A light passing through the aperture 12A of the diaphragm 12 is irradiated to the mask 14 through the lens 13, and a pattern formed on the mask 14 passes through a lens 15 and is imaged on a surface of a wafer 16. In the first embodiment, the aperture 12A of the diaphragm 12 is set to three conditions shown in FIGS. 3A, 3B and 3C. FIG. 3A shows an off-axis, e.g., a zone illumination which does not use light from the center of the light source but uses peripheral light. FIG. 3B shows a standard illumination in which the aperture 12A has a radius σ=0.6. FIG. 3C shows a coherent illumination in which the aperture 12A has a radius σ<0.6. Further, an obstruction ratio of the zone illumination and a radius of the aperture 12A at the time of the coherent illumination will be described later.

Figure 4:
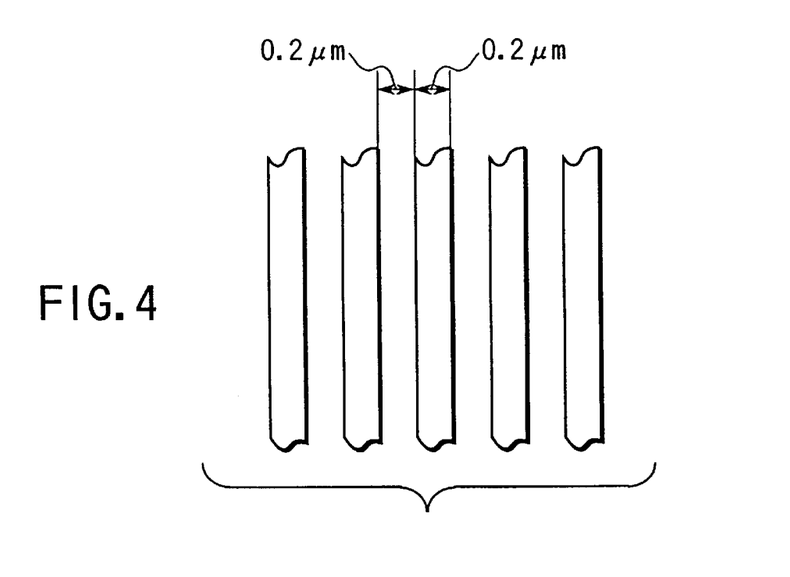
FIG. 4 is a plan view showing one example of a gate pattern of DRAM.
Figure 5:
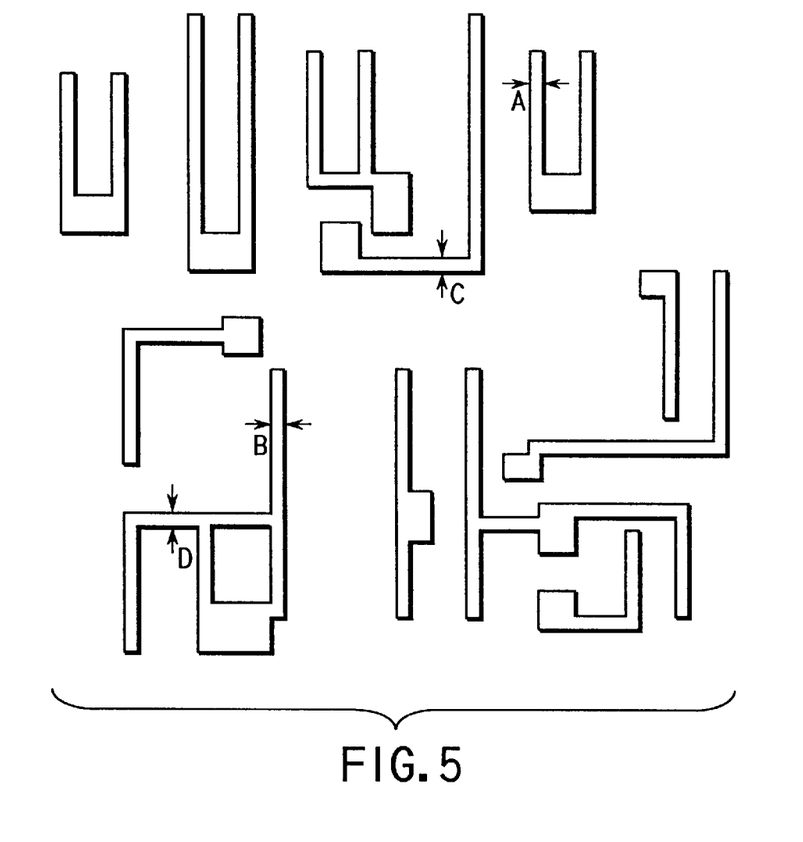
FIG. 5 is a plan view showing one example of a pattern of a peripheral circuit of DRAM.

Based on such illuminating conditions, a simulation is conducted with respect to a circuit pattern of the DRAM shown in FIGS. 4 and 5, using data concerning the lithography as a parameter. FIG. 4 shows a gate pattern constituting a memory cell array of the DRAM, and shows lines and spaces each having a width of 0.2 μm. FIG. 5 shows patterns of the peripheral circuits, and a simulation is conducted based on CAD data of portions of patterns A, B, C and D.

Figure 1:
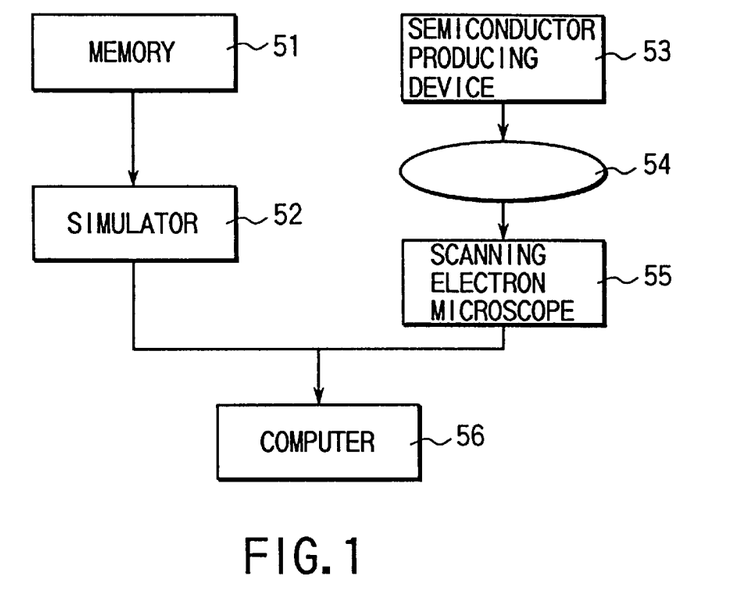
FIG. 1 is a flow diagram showing a structure of a correcting system according to the present invention.

FIG. 1 schematically shows a correcting system applied to the present invention. CAD data corresponding to, e.g., a pattern of the DRAM is stored in a memory 51 such as a hard disk. A simulator 52 is connected to the memory 51. The simulator 52 carries out a simulation which will be described later, in accordance with the CAD data supplied from the memory 51. A semiconductor producing device 53 comprises a known light-exposing device, an etching device and the like, and changes the illuminating condition or light-exposing conditions to produce a wafer 54, as shown in FIGS. 4 and 5, on which an evaluation pattern is formed. A scanning electron microscope 55 measures a final size of the pattern formed on the wafer 54, thereby measuring a width and a length of the pattern. A computer 56 obtains a deviation amount of each of patterns which is deviated from the corresponding optimal pattern, and calculates a correction value of the mask pattern, based on the deviation amount and the simulation result supplied from the simulator 52. The computer 56 may also serve as the simulator 52.

Figure 6:
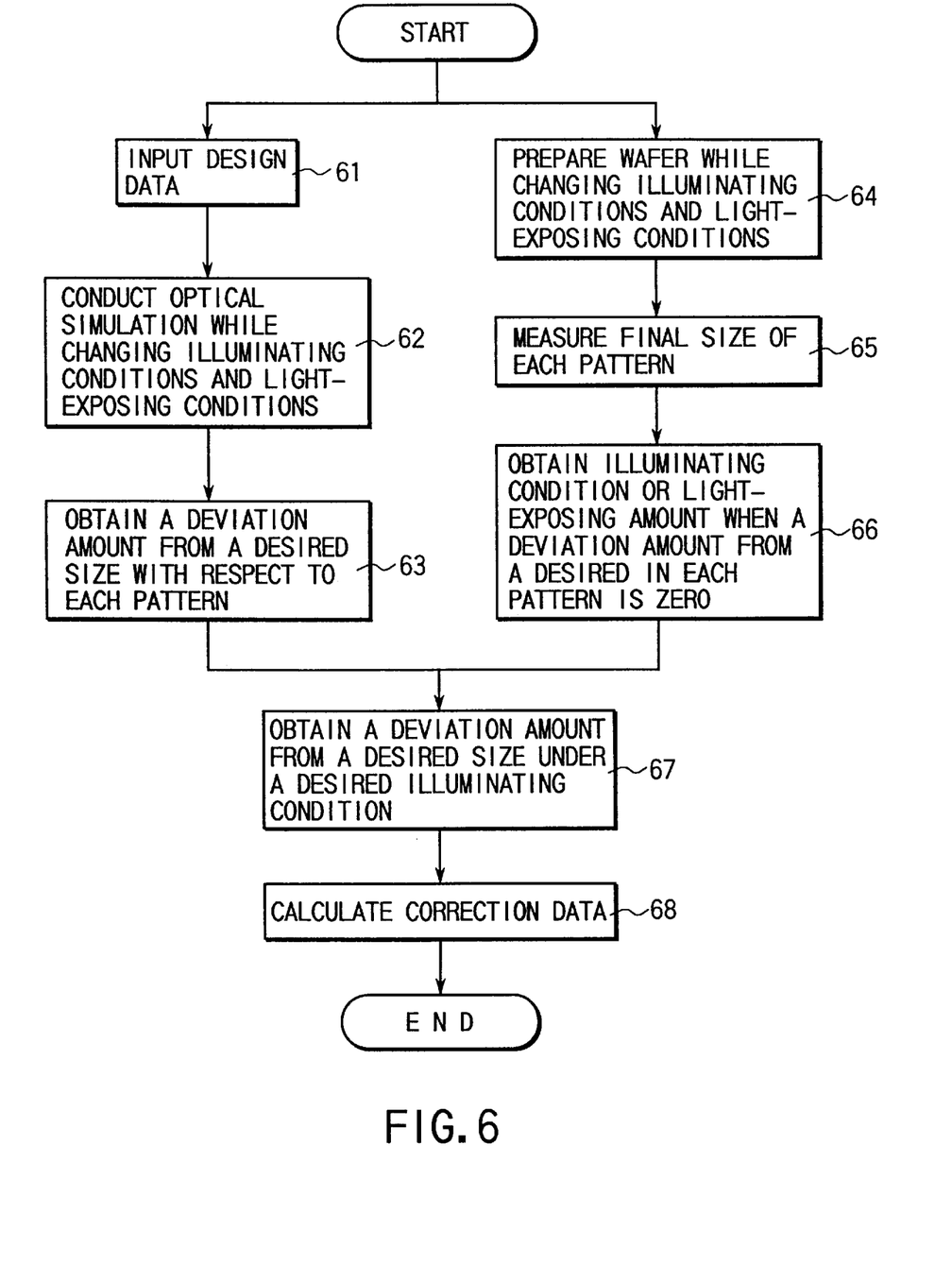
FIG. 6 is a flow chart showing an operation of a first embodiment of the present invention.

FIG. 6 shows an operation of FIG. 1, and shows the correcting method of the first embodiment. The simulator 52 reads in the CAD data of the DRAM stored in the storage 51, and conducts an optical-image simulation with respect to the CAD data under seven kinds of illuminating conditions. In the illuminating conditions, a radius σ of the aperture and an obstruction ratio ε of the zone illumination are varied for each of the zone illumination, the standard illumination and the coherent illumination. Here, ε is a value represented by ε=σ1/σ, as shown in FIG. 3A. In the first embodiment, the radius σ of the aperture for the standard illumination is set to 0.6, the radius σ of the aperture for the coherent illumination is set to 0.5, 0.4 and 0.3, and the radius σ of the aperture for the zone illumination is set to 0.67, 0.50 and 0.33.

An amount deviated from a desired size with respect to each pattern is obtained by the simulation result based on these illuminating conditions (steps 61, 62 and 63).

Table 1 shows a simulation result when an irradiation amount is added to the cell region of the DRAM. As shown in Table 1, approximate values with respect to: values of δ aerial,(I)–δ aerial,(II); a cell pattern shown in FIG. 4; and patterns A, B and C of peripheral circuits shown in FIG. 5 could be obtained. In Table 1, pattern biases of the zone illumination and the coherent illumination on the patterns A, B and C are shown as differences from CD of the standard illumination wherein the illumination condition (I) is standard illumination.

TABLE 1

(bias: μm)

| Illumination | off-axis | | | standard | small σ | | |
|---|---|---|---|---|---|---|---|
| σ | | 0.6 | | | 0.5 | 0.4 | 0.3 |
| ε | 0.67 | 0.50 | 0.33 | | 0 | | |
| Bias on Cell pattern | | | | 0 | | | |
| Bias on Pattern A | −0.06 | −0.04 | −0.01 | 0 | +0.01 | +0.04 | +0.06 |
| Bias on Pattern B | −1.00 | −0.05 | −0.02 | 0 | +0.03 | +0.04 | +0.05 |
| Bias on Pattern C | −0.08 | −0.03 | 0 | 0 | +0.01 | +0.02 | +0.04 |
| Bias on Pattern D | −0.06 | −0.03 | −0.01 | 0 | +0.02 | +0.04 | +0.06 |

On the other hand, similar to the above-described simulation, the semiconductor producing device 53 conducts a light-exposing, a developing and an etching under, e.g., seven illuminating conditions, and produces seven kinds of wafers 54 on which evaluation patterns are formed as shown in FIGS. 4 and 5 (step 64). After that, a final size of the pattern formed on each of the produced wafers 54 is measured by the scanning electron microscope 55 (step 65). Then, the computer 56 obtains an illuminating condition or a light-exposing condition under which an amount deviated from a desired size in each pattern becomes zero (step 66).

Table 2 shows an illuminating condition for obtaining a total process bias δ total is zero on each pattern provided by the above-described measurement result.

TABLE 2

| Illumination | off-axis | | | standard | small σ | | |
|---|---|---|---|---|---|---|---|
| σ | | 0.6 | | | 0.5 | 0.4 | 0.3 |
| ε | 0.67 | 0.50 | 0.33 | | 0 | | |
| Bias on Cell pattern | | | | 0 | | | |
| Bias on Pattern A | | | − | | | 0 | + |
| Bias on Pattern B | | − | | 0 | | + | |
| Bias on Pattern C | − | 0 | | | + | | |
| Bias on Pattern D | | | − | | 0 | | + |

Using the equation (4), a deviation amount from the desired size under the desired illuminating condition is calculated from the experimentally obtained CD difference (δ total (I)–δ total (II)) and the CD difference (δ aerial(I)–δ aerial(I))) obtained by the simulation (step 67). A correction data of the mask is calculated from this deviation amount (step 68). That is, using the equation (4) and Tables 1 and 2, a width of the pattern under the target illuminating condition is corrected in the following manner. The target illuminating condition is determined by a lithography latitude (appropriate light-exposing latitude), a condition of the exposing device and the like. Here, a standard illuminating condition (σ=0.6) was used as an example.

In the case of pattern A, an illuminating condition under which a bias becomes zero is σ=0.4. The CD difference from the memory cell array corresponding to σ=0.4 by the simulation result is +0.04 μm as shown in Table 1, and the CD difference from the memory cell array in the standard illumination is zero. If these numeric values are entered into the equation (4), the correction value will be as follows:

Pattern A:

$$\delta\text{ total,(standard)} = \delta\text{ total,}(\sigma=0.4) + (\delta\text{ aerial,(standard)} - \delta\text{ aerial,}(\sigma=0.4)) = (0) - 0.04\ \mu m$$

∴ correction value = −0.04 μm

Pattern B:

Because CD difference from the cell pattern in standard illustration condition does not exist, no correction is required.

Correction values for the patterns C and D are obtained in the similar manner to the pattern A.

Pattern C:

$$\delta\text{ total,(standard)}=\delta\text{ total,}(\epsilon=0.50)+(\delta\text{ aerial,(standard)}-\delta\text{ aerial,}(\epsilon=0.50))=(0)-(-0.03)\mu m$$

∴ correction value=+0.03 μm

Pattern D:

$$\delta\text{ total,(standard)}=\delta\text{ total,}(\sigma=0.5)+(\delta\text{ aerial,(standard)}-\delta\text{ aerial,}(\sigma=0.5))=(0)-0.02\ \mu m$$

∴ correction value=−0.02 μm

According to the first embodiment, a correction value of the mask pattern is provided by a result of a simulation using CAD data corresponding to an actual circuit pattern, and by DATA obtained experimentally from an evaluation pattern produced while changing the illuminating conditions. Therefore, it is possible to accurately characterize the simulation result and the experimental data and therefore, it is possible to obtain an accurate mask pattern including the lithography margin. By correcting the mask pattern using this correction value, the optical proximity effect can reliably be corrected.

According to the first embodiment, patterns of actual devices are used as patterns A–D. In order to quantify the optical proximity effect, it is possible to use, for example, 0.25 μm test patterns, such as those shown in FIGS. 9A and 9B. In the test patterns, the distances S between a pattern measured by a scanning electronic microscope or an electric characteristic evaluation system and a pattern located in proximity to that pattern are determined to be within the range of 0.25 to 60 μm. Therefore, the test patterns can be used for examining how the optical proximity effect is dependent on the distance S between proximate patterns. In addition, if different pattern densities are prepared, such as the low pattern density shown in FIG. 9A (wherein the number of proximate patterns arranged on each side of the measured pattern is 3) and the 50% pattern density shown in FIG. 9B (wherein the number of proximate patterns arranged on each side is 50), it is possible to examine how the optical proximity effect is dependent on the pattern density. As can be understood from this, it is possible to accurately know how the proximity effect is dependent on the distance between adjacent patterns or on the pattern density, when the evaluation results obtained from the test patterns are used in combination with the apparatus and method of the embodiment. Correction data, obtained thereby, ensures high-precision correction.

Second Embodiment

A second embodiment of the present invention will be described next.

Figure 7:
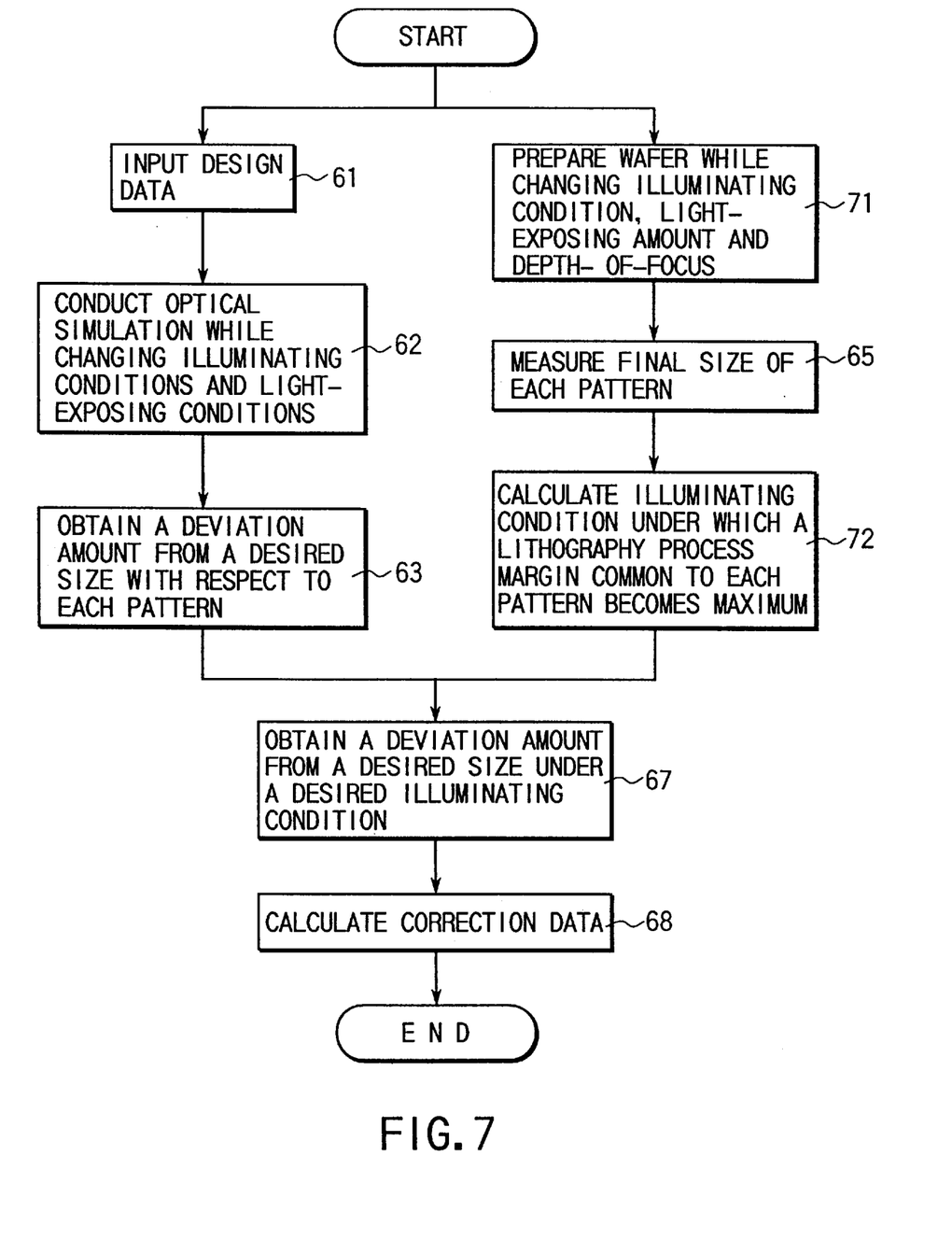
FIG. 7 is a flow chart showing an operation of a second embodiment of the present invention.

FIG. 7 shows a correcting method of the second embodiment. In FIG. 7, portions corresponding to those in FIG. 6 will be denoted by the same reference numbers, and only different portions will be explained. The second embodiment makes it possible to correct a mask pattern including a lithography process latitude such as a depth-of-focus and a dose latitude. More specifically, when a wafer on which an evaluation pattern is formed by, e.g., the semiconductor producing device 53, the wafer is produced while changing the lithography process latitude such as the depth-of-focus and the dose latitude (step 71). Then, a final size of each the evaluation pattern is measured by the scanning electron microscope 55 (step 65). A bias of each the evaluation pattern is obtained based on the measurement data from the scanning electron microscope.

Figure 8:
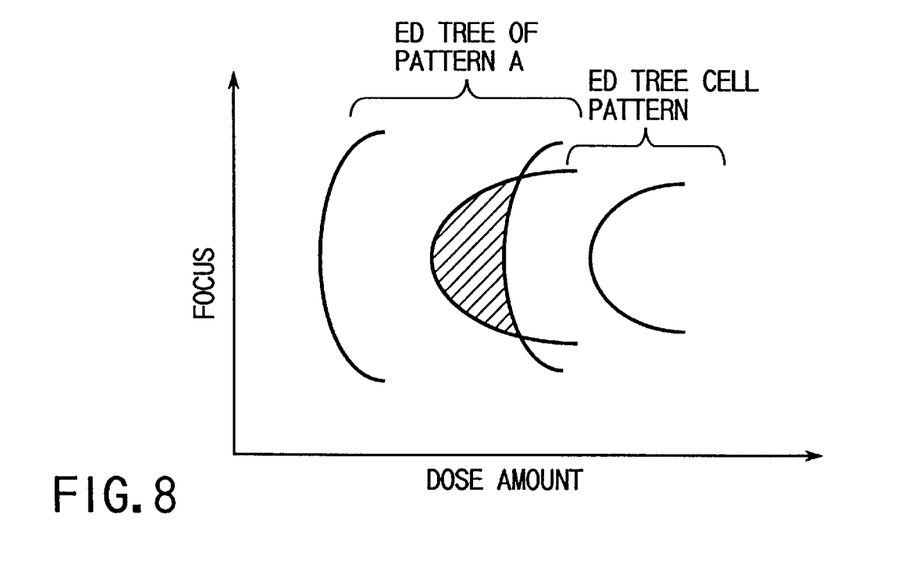
FIG. 8 is a characteristic diagram showing the operation of the second embodiment of the present invention.

FIG. 8 shows an example of a manner is which pattern A having no corrections applied thereto is related to the depth-of-focus and the dose amount of the memory cell. Such a characteristic diagram is prepared for each of the patterns B, C and D , and an illuminating condition under which a process window becomes maximum is obtained, as shown in Table 3. Further, an illuminating condition under which the patterns A, B and C, as well as the common process window become maximum is obtained (step 72). In the case of this embodiment, since the common process window becomes maximum when $\epsilon=0.33$ the illuminating condition of $\epsilon=0.33$ was used, as shown in Table 3.

TABLE 3

| Illumination | off-axis | | | standard | small σ | | |
| --- | --- | --- | --- | --- | --- | --- | --- |
| σ | | | 0.6 | | 0.5 | 0.4 | 0.3 |
| ε | 0.67 | 0.50 | 0.33 | | 0 | | |
| Cell pattern | Max. | | | | | | |
| Pattern A | | | | | | Max. | |
| Pattern B | | | | Max. | | | |
| Pattern C | | | Max. | | | | |
| Pattern D | | | | | | Max. | |
| Common Window (for Cell, A, B, C, D) | | | Max. | | | | |

By using Tables 1 and 3, as well as the equation (4), a correction value of each the pattern can be obtained as shown below (steps 67 and 68). A manner for obtaining the correction value is the same as that described in the first embodiment. The correction values for the various patterns will be as follows:

Pattern A:

$$\delta\text{ total,}(\epsilon=0.33)=\delta\text{ total,}(\sigma=0.4)+(\delta\text{ aerial,}(\epsilon=0.33)-\epsilon\text{ aerial,}(\sigma=0.4))=(0)+((-0.01)-0.04)\mu m$$

∴ correction value=−0.05 μm

Pattern B:

$$\delta\text{ total,}(\epsilon=0.33)=\epsilon\text{ total,(standard)}+(\delta\text{ aerial,}(\epsilon=0.33)-\delta\text{ aerial,(standard)})=(0)+(-0.02-0)\mu m$$

∴ correction value=−0.02 μm

Pattern C:

Since as can be seen from Table 3, the illuminating condition under which the maximum process window is obtained is the same as the illuminating condition under which the maximum common process window is obtained, no correction is required.

Pattern D:

$$\delta\text{ total,}(\epsilon=0.33)=\delta\text{ total,}(\sigma=0.4)+(\delta\text{ aerial,}(\epsilon=0.33)-\delta\text{ aerial,}(\sigma=0.4))=(0)+(-0.01-0.04)\mu m$$

∴ correction value=−0.05 μm

According to the above-described correcting method, it is possible to accurately characterize the simulation result and the experimental data by obtaining the maximum lithography process latitude.

In this second embodiment, although Table 3 was obtained from the experimental data, it is possible to obtain Table 3 also from a simulation. More specifically, in this case, simulations for the memory cell and the peripheral circuit patterns are conducted while changing the lithography process latitude such as the depth-of-focus and the dose latitude, thereby obtaining an illuminating condition under which each pattern has the maximum process window. Further, an illuminating condition under which the common process window of the memory cell and the peripheral circuit patterns has the maximum value is obtained.

Figure 9A:
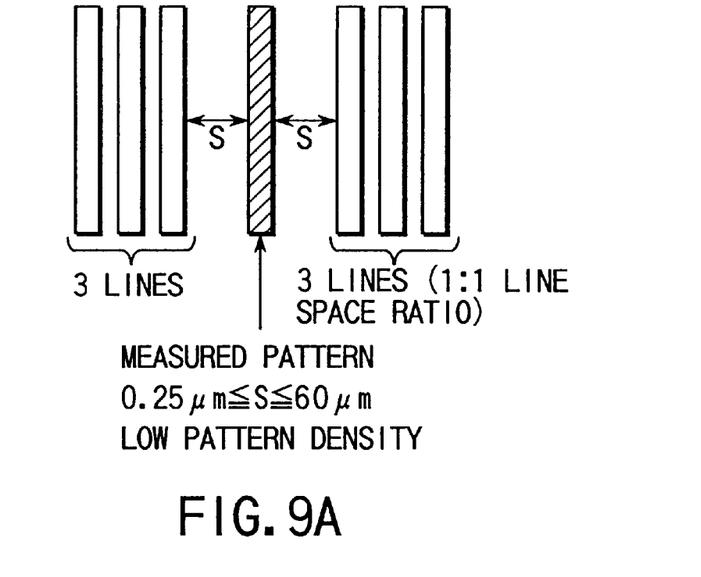
FIGS. 9A and 9B are a plan view showing test patterns, respectively.
Figure 9B:
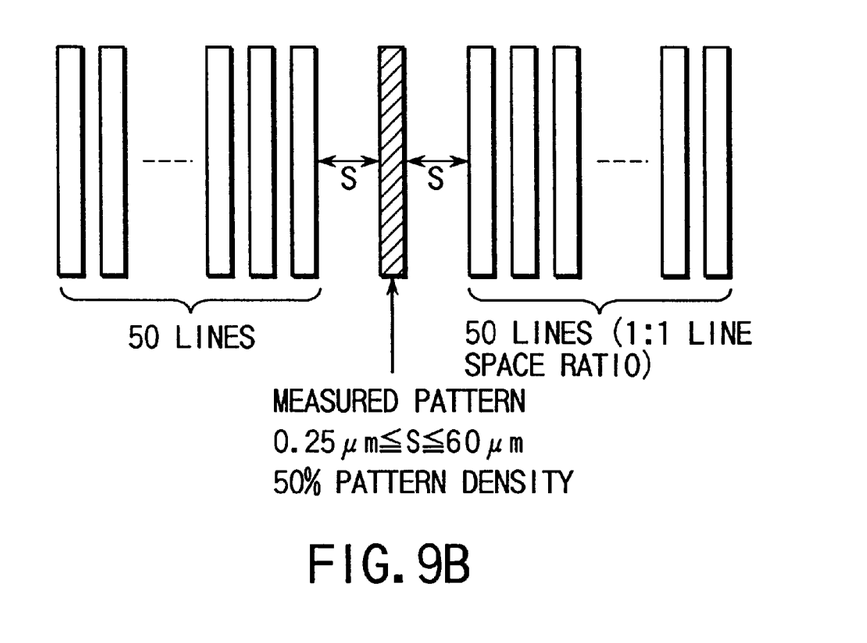

As described above, by conducting simulations for obtaining an illuminating condition under which each pattern has the maximum process window and an illuminating condition under which the common process window has the maximum value, it is unnecessary to produce an evaluation pattern, and it is possible to conduct the process at higher speed.

Where test patterns such as those shown in FIGS. 9A and 9B are used in the second embodiment, high-precision correction is enabled as in the first embodiment.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A correcting system for a mask pattern comprising:
   a memory device for storing a plurality of pattern data of a semiconductor integrated circuit;
   a simulator for simulating an optical-image of the pattern data of said semiconductor integrated circuit supplied from the memory device based on different illuminating conditions, said simulator calculating an amount of a pattern bias in each of said illuminating conditions based on a result of said optical-image simulation, wherein the amount of pattern bias is a difference between a size of a reference pattern and a size of said optical-image simulated by the simulator;
   a producing device for producing an evaluation pattern for evaluating a characteristic of said semiconductor integrated circuit on a wafer based on said different illuminating conditions;
   a measuring device for measuring a final size of said evaluation pattern produced by said producing device;
   a first calculating section for calculating an illuminating condition so that the pattern bias of the pattern serves as zero based on the final size measured by said measuring device; and
   a second calculating section for calculating a correction value of the mask pattern based on the amount of the pattern bias calculated by said simulator and said illuminating condition calculated by said first calculating section.

2. A system according to claim 1, wherein said illuminating condition includes a standard illumination, a plurality of zone illuminations having different obstruction ratios, and a plurality of coherent illuminations having different opening radii.

3. A system according to claim 1, wherein said evaluation pattern includes a gate pattern of a memory cell and a pattern of a peripheral circuit.

4. A system according to claim 1, wherein said semiconductor integrated circuit is one of a DRAM, an SRAM, a nonvolatile memory, and a logic circuit.

5. A system according to claim 1, wherein said simulator and said first and second calculating sections are included in one computer.

6. A system according to claim 1, wherein said simulator simulates the optical-image of the pattern data of the semiconductor integrated circuit by using at least an illumination condition as a parameter.

7. A system according to claim 1, wherein said second calculating section calculates the correction value of the mask pattern by using said illuminating condition calculated by said first calculating section and a following equation $$\delta\text{ total, (I)} = \delta\text{ total, (II)} + (\delta\text{ aerial, (I)} - \delta\text{ aerial, (II)})$$

wherein, δ total, (I) and δ total, (II) are total pattern biases in illumination conditions (I) and (II), respectively, and δ aerial, (I) and δ aerial, (II) are the total pattern biases due to aerial image in the illuminating conditions (I) and (II), respectively.

8. A system according to claim 1, wherein said reference pattern is a pattern simulated by using a standard illumination condition.

9. A correcting system for a mask pattern comprising:
   a memory for storing a plurality of pattern data of a semiconductor integrated circuit;
   a simulator for simulating an optical-image of the pattern data of said semiconductor integrated circuit supplied from the memory device based on different illuminating conditions, said simulator calculating an amount of a pattern bias based on a result of said optical-image simulation, wherein the amount of pattern bias is a difference between a size of a reference pattern and a size of said optical-image simulated by the simulator;
   a producing device for producing an evaluation pattern for evaluating a characteristic of said semiconductor integrated circuit on a wafer based on said different illuminating conditions;
   a measuring device for measuring a final size of said evaluation pattern produced by said producing device;
   a first calculating section for calculating an illuminating conditions in which a common process window of each of said evaluation patterns becomes maximum based on the final size measured by said measuring device; and
   a second calculating section for calculating a correction value of the mask pattern based on the amount of pattern bias calculated by said simulator and the illuminating condition calculated by said first calculating section.

10. A system according to claim 9, wherein said illuminating condition includes a standard illumination, a plurality of zone illuminations having different obstruction ratios, and a plurality of coherent illuminations having different opening radii.

11. A system according to claim 9, wherein said evaluation pattern includes a gate pattern of a memory cell and a pattern of a peripheral circuit.

12. A system according to claim 9, wherein said semiconductor integrated circuit is one of a DRAM, an SRAM, a nonvolatile memory, and a logic circuit.

13. A system according to claim 9, wherein said simulator and said first and second calculating sections are included in one computer.

14. A system according to claim 9, wherein said simulator simulates the optical-image of the pattern data of the semiconductor integrated circuit by using at least illumination condition as a parameter.

15. A system according to claim 9, wherein said second calculating section calculates the correction value of the mask pattern by using said illuminating condition calculated by said first calculating section and a following equation:

$$\delta\text{ total, (I)} = \delta\text{ total, (II)} + (\delta\text{ aerial, (I)} - \delta\text{ aerial, (II)})$$

wherein, δ total, (I) and δ total, (II) are a total pattern bias in illumination conditions (I) and (II), respectively, and δ aerial, (I) and δ aerial, (II) are the total pattern bias due to aerial image in the illuminating conditions (I) and (II), respectively.

16. A system according to claim 9, wherein said reference pattern is a pattern simulated by using a standard illumination condition.

17. A correcting method for a mask pattern comprising the steps of:

simulating an optical-image for a plurality of pattern data of a semiconductor integrated circuit based on different illuminating conditions, and calculate an amount of a pattern bias in each of said illuminating conditions based on the result of said optical-image simulation, wherein the amount of pattern bias is a difference between a size of a reference pattern and a size of said optical-image simulated by the simulator;

producing an evaluation pattern for evaluating a characteristic of said semiconductor integrated circuit on a wafer based on said different illuminating conditions;

measuring a final size of the produced evaluation pattern; and said method further comprising:

a first calculating step for calculating an illuminating condition so that the pattern bias of the pattern serves as zero based on the measured final size; and a second calculating step for calculating a correction value of the mask pattern based on the amount of pattern bias calculated by said simulation and said illuminating condition calculated by said first calculating step.

18. A method according to claim 17, wherein said illuminating condition includes a standard illumination, a plurality of zone illuminations having different obstruction ratios, and a plurality of coherent illuminations having different opening radii.

19. A method according to claim 17, wherein said evaluation pattern includes a gate pattern of a memory cell and a pattern of a peripheral circuit.

20. A method according to claim 17, wherein said simulation and said first and second calculating steps are conducted by one computer.

21. A system according to claim 17, wherein said reference pattern is a pattern simulated by using a standard illumination condition.

22. A correcting method for a mask pattern comprising the steps of:

simulating an optical-image for a plurality of pattern data of a semiconductor integrated circuit based on different illuminating conditions, and calculate an amount of a pattern bias in each of said illuminating conditions based on the result of said optical-image simulation, wherein the amount of pattern-bias is a difference between a size of a reference pattern and a size of said optical-image simulated by the simulator;

producing an evaluation pattern for evaluating a characteristic of said semiconductor integrated circuit on a wafer based on said different illuminating conditions;

measuring a final size of said produced evaluation pattern; and said method further comprising:

a first calculating step for calculating an illuminating condition in which a common process window of each of said evaluation patterns becomes maximum from the measured final size; and a second calculating step for calculating a correction value of the mask pattern based on the amount of pattern bias calculated by said simulation and the illuminating condition calculated by said first calculating step.

23. A method according to claim 22, wherein said illuminating condition includes a standard illumination, a plurality of zone illuminations having different obstruction ratios, and a plurality of coherent illuminations having different opening radii.

24. A method according to claim 22, wherein said evaluation pattern includes a gate pattern of a memory cell and a pattern of a peripheral circuit.

25. A method according to claim 22, wherein said simulation and said first and second calculating steps are conducted by one computer.

26. A system according to claim 22, wherein said reference pattern is a pattern simulated by using a standard illumination condition.

* * * * *

UNITED STATES PATENT AND TRADEMARK OFFICE
CERTIFICATE OF CORRECTION

PATENT NO.    : 6,128,067
DATED         : October 3, 2000
INVENTOR(S)   : Koji Hashimoto It is certified that error appears in the above-identified patent and that said Letters Patent is hereby corrected as shown below:

On the cover page, in the References Cited [56]:

--5,530,518    6/1996  Ushida et al.    355    53
      5,825,647   10/1998  Tsudaka        364    167.03-- has been added.

Signed and Sealed this

Nineteenth Day of June, 2001

*Attest:*

Nicholas P. Godici

*Attesting Officer*

NICHOLAS P. GODICI
*Acting Director of the United States Patent and Trademark Office*